United States Patent [19]
Parmet

[11] 4,268,915
[45] May 19, 1981

[54] UNIVERSAL AUTOMOTIVE ELECTRONIC RADIO WITH DISPLAY FOR TUNING OR TIME INFORMATION

[75] Inventor: Bernard S. Parmet, Park Ridge, Ill.

[73] Assignee: Motorola, Inc., Schaumburg, Ill.

[21] Appl. No.: 77,201

[22] Filed: Sep. 20, 1979

Related U.S. Application Data

[60] Continuation of Ser. No. 789,597, Apr. 21, 1977, abandoned, which is a division of Ser. No. 583,343, Jun. 2, 1975, Pat. No. 4,135,158.

[51] Int. Cl.³ .............................................. H04B 1/16
[52] U.S. Cl. ...................................... 455/158; 368/10
[58] Field of Search ......................... 235/92 T, 92 TF; 340/309.1, 309.3, 309.4, 721, 745; 58/23 R, 35 W, 50 R, 152 R; 455/154–159, 181; 331/64, DIG. 2; 358/192.1

[56] References Cited

U.S. PATENT DOCUMENTS

| | | | |
|---|---|---|---|
| 3,034,054 | 5/1962 | Brisbane | 331/DIG. 2 |
| 3,249,876 | 5/1966 | Harrison | 455/183 |
| 3,753,119 | 8/1973 | Close | 455/157 |
| 4,081,797 | 3/1978 | Olson | 340/706 |

FOREIGN PATENT DOCUMENTS

| | | | |
|---|---|---|---|
| 52-22416 | 2/1977 | Japan | 455/181 |
| 52-67208 | 6/1977 | Japan | 455/158 |

*Primary Examiner*—Marc E. Bookbinder

*Attorney, Agent, or Firm*—Phillip H. Melamed; James W. Gillman; Donald J. Lisa

[57] ABSTRACT

Selected radio circuits are fabricated on modules which plug into a "mother" board located in the radio chassis. The circuitry includes a plurality of RF front ends (including at least one AM and one FM front end), each tunable over a selected radio band by tuner circuitry. The AM front end includes a saturable core reactor whose tuning inductance varies as a function of the tuning current provided to it by a voltage-to-current converter in the tuner.

Both AM and FM signals are translated by a frequency synthesizer to a common IF frequency, namely 10.7 MHz. The synthesizer employs a quartz crystal controlled oscillator feeding a phase lock loop whose frequency is varied via the tuning control. Quartz crystal filters for AM, and ceramic filters for FM provide required selectivity. As all signals are at the same IF, a common IF amplifier is employed. Further, a single phase lock loop is adapted to demodulate both AM and FM signals.

The resultant demodulated signals are amplified, and tone shaped, via D. C. voltage controlled audio processor circuitry. The audio circuitry is adapted to accept auxiliary inputs, such as the output of a tape player.

A digital display senses tuner status providing frequency read out. Additional provisions allow switching the display to read out tape player status, or to provide a time display from an electronic clock.

17 Claims, 7 Drawing Figures

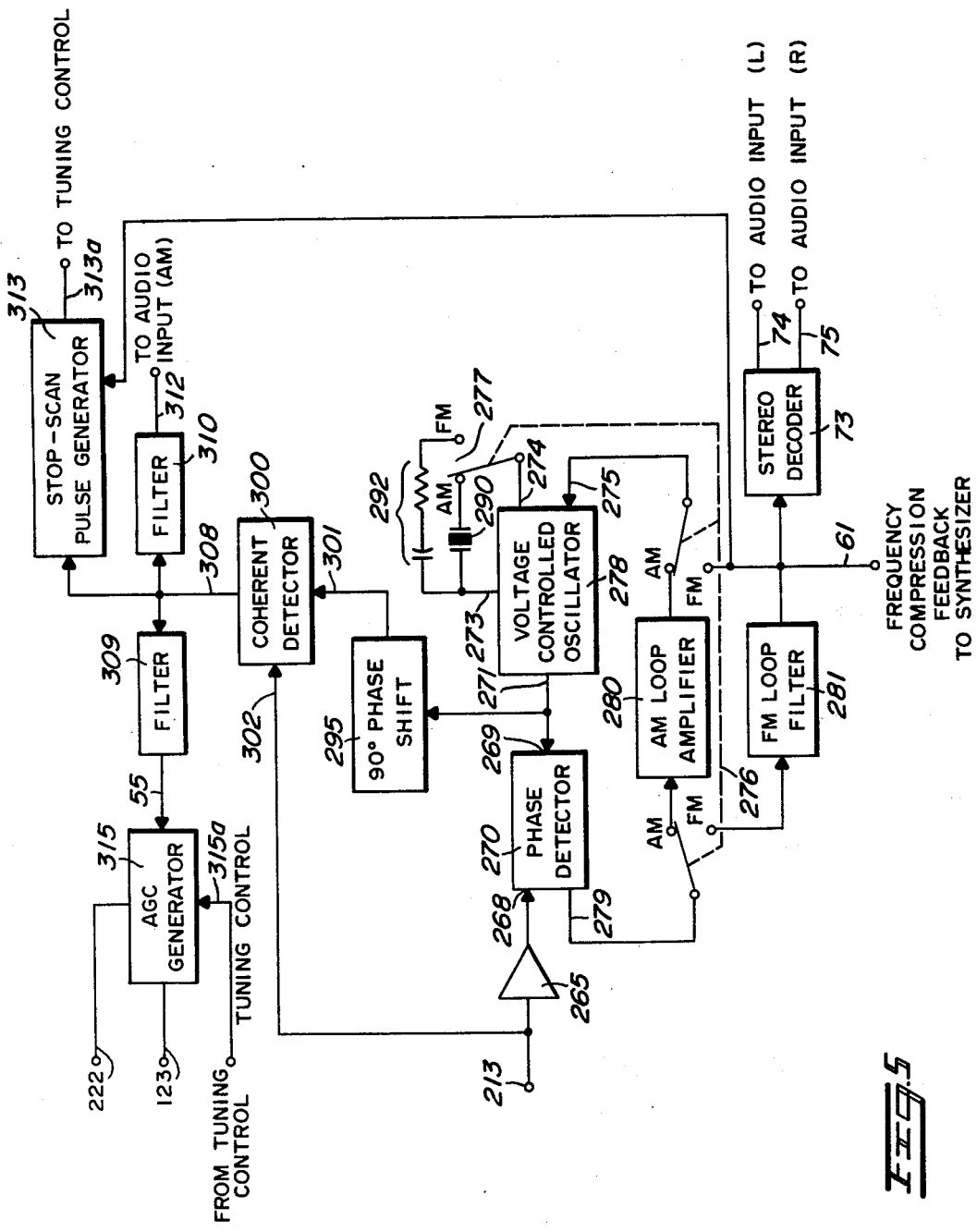

UNIVERSAL AUTOMOTIVE ELECTRONIC RADIO WITH DISPLAY FOR TUNING OR TIME INFORMATION

This is a continuation, of application Ser. No. 789,597, filed Apr. 21, 1977 now abandoned which was a divisional of application Ser. No. 853,343, filed June 2, 1975 now U.S. Pat. No. 4,135,158.

BACKGROUND OF THE INVENTION

This invention relates to automotive radio receivers and, more particularly, to improvements in the same.

Radios designed to mount in the dashboard of an automobile are commonplace. Because the radios are mounted in a limited space, they must be highly compact. Further, due to their mobile nature, such radios must have stringent circuit performance in order to handle the variable signal conditions they will encounter. Moreover, the automotive radio industry is highly competitive and the market place demands a reliable yet inexpensive product. The conflicting requirements of performance and size versus cost have forced the manufacturer to make serious tradeoffs. His ultimate design, invariably, involves numerous sacrifices.

In addition, altering an existing radio design to provide different or additional features has proved difficult. Rather than add FM circuitry to an existing AM radio design, manufacturers have had to redesign the entire radio to be AM/FM compatible. Modification of an existing radio designed for operation in the United States to the European system has similarly proved difficult.

The most troublesome part of a conventional car radio is the mechanical tuner. Commonly, such tuners employ slug tuned coils. A mechanical linkage transfers rotational actuation of the tuning knob to a lateral translation of cores within the slug tuned coils, and also provides approximate indication of tuning frequency. Such tuners are quite bulky and, as they are mechanical, have reliability problems. These problems are multiplied when push button type programmed tuning is desired. In addition automotive radios have been clumsy to operate. Proper tuning of all radios is critical, and, in a moving environment such tuning is difficult. To overcome these problems mechanical "automatic search" systems have been developed. These systems have proved to be bulky, expensive, and unreliable.

Due to advances in solid state technology, it is becoming increasingly more feasible to replace mechanical systems with their more reliable electronic counterparts. Advances such as large scale integration of active electronic devices in extremely compact integrated circuit form allow designers options not available heretofore. Further, "all electronic" systems allow modular "plug in" type designs, rendering a more easily serviceable and alterable product.

OBJECTS OF THE INVENTION

It is an object of the present invention, therefore, to provide a more compact, higher performance, all electronic automotive radio using state of the art technology.

It is a further object of the invention to provide an all electronic radio of the above described type which provides fully automatic, precision tuning.

Another object of the invention is to provide an all electronic radio of the above described type which includes a precision digital readout, which readout is adaptable to display the frequency to which the radio is tuned as well as the status of a tape deck or real time.

It is a further object of the invention to provide an all electronic radio of the above described type which is composed of a series of unit plug in modules, whereby radio alteration or service is effected by replacing a particular module.

Briefly, a fully electronic radio, according to the instant invention, comprises a plurality of input RF front ends. Included is at least one AM front end and one FM front end. Each front end includes an RF filter which is tunable over a desired band to pass selected signals in that band. A band switch provides fully electronic switching to select a desired front end. The output of the selected front end is translated to a single predetermined intermediate frequency via a frequency variable translator. Both the RF front ends, and the translator are synchronously varied via a tuning control. Since all signals are converted to a single intermediate frequency, a common intermediate amplifier is employed. Thereafter, a single phase lock loop decoder demodulates both the AM and FM signals to baseband audio signals. These audio signals are further processed through audio reproduction means, which means are voltage variable to alter the amplitude and tone characteristics of the audio signal. The resultant signals are transduced to audibility.

BRIEF DESCRIPTION OF THE DRAWINGS

FIG. 5 is a detailed block diagram of the common phase lock loop demodulator.

DETAILED DESCRIPTION OF A PREFERRED EMBODIMENT OF THE INVENTION

The invention is better understood with reference to the figures wherein common numbers for the same or similar items have been used throughout to more clearly depict the preferred embodiment of the invention.

Figure 1:
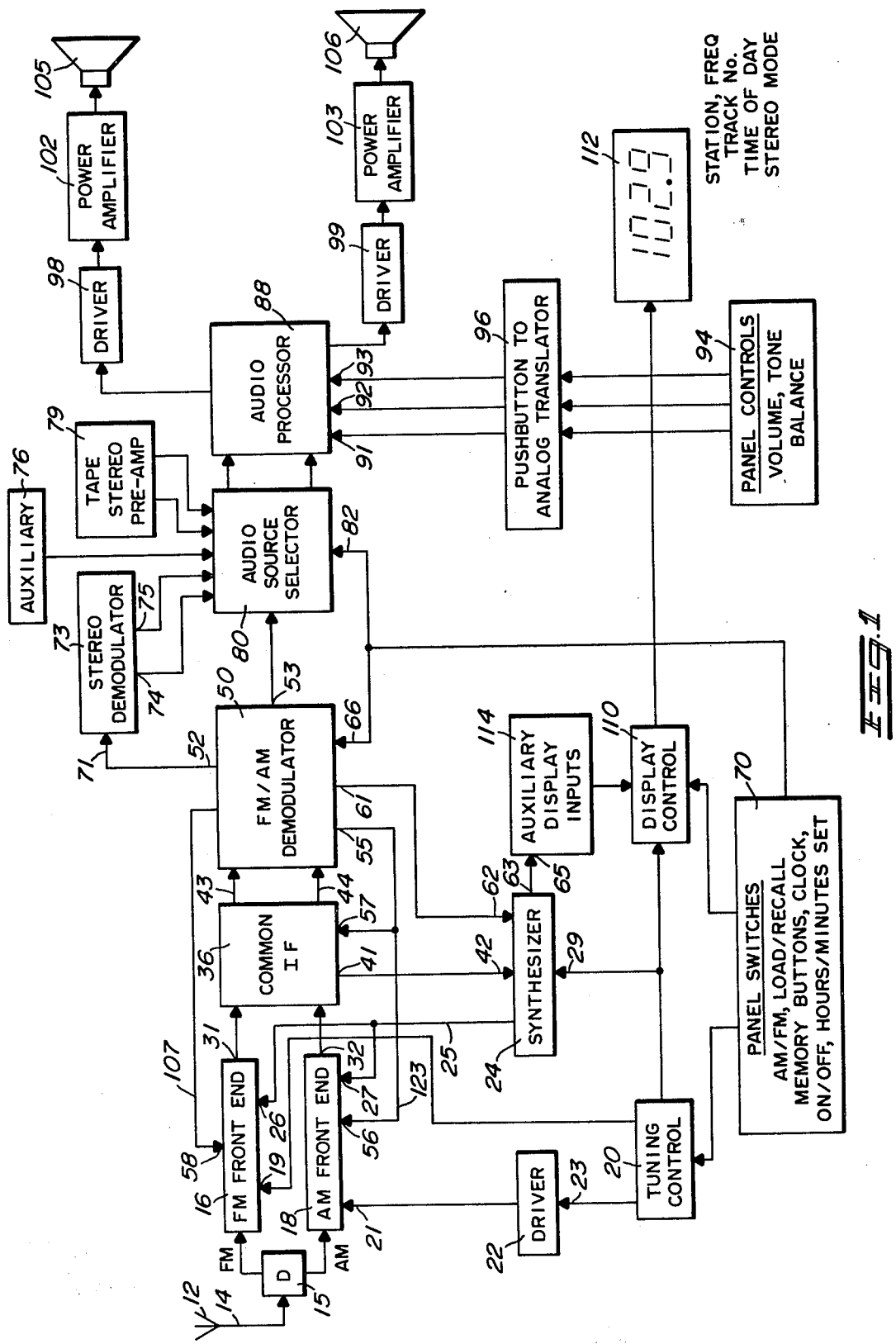
FIG. 1 is a block diagram of an AM/FM radio according to the invention.

Referring to FIG. 1, a universal electronic radio according to the invention is shown in block form. An antenna 12 collects broadcast RF signals and conducts them via line 14 to the diplexer 15. The diplexer contains low and high pass filters routing the FM band signals to the FM front end 16, and the AM signals to the AM front end 18. A bandswitch control acts through a tuning control 20 to activate a selected front end 16 or 18. The front ends 16, 18 are more fully discussed with reference to FIG. 2, however each contains an RF filter which is electronically tunable over a desired band to pass selected signals. In the preferred embodiment, the tuning component in the FM filter is a reverse biased silicon junction diode whose capacitance changes in a predetermined way as a function of a control voltage applied at front end terminal 19 by tuning control 20. The AM tuning element is a saturable core reactor whose inductance changes as a function of current applied at AM front end terminal 21 via a voltage-to-current driver 22 which also receives a tuning control signal at its input 23.

Figure 3:
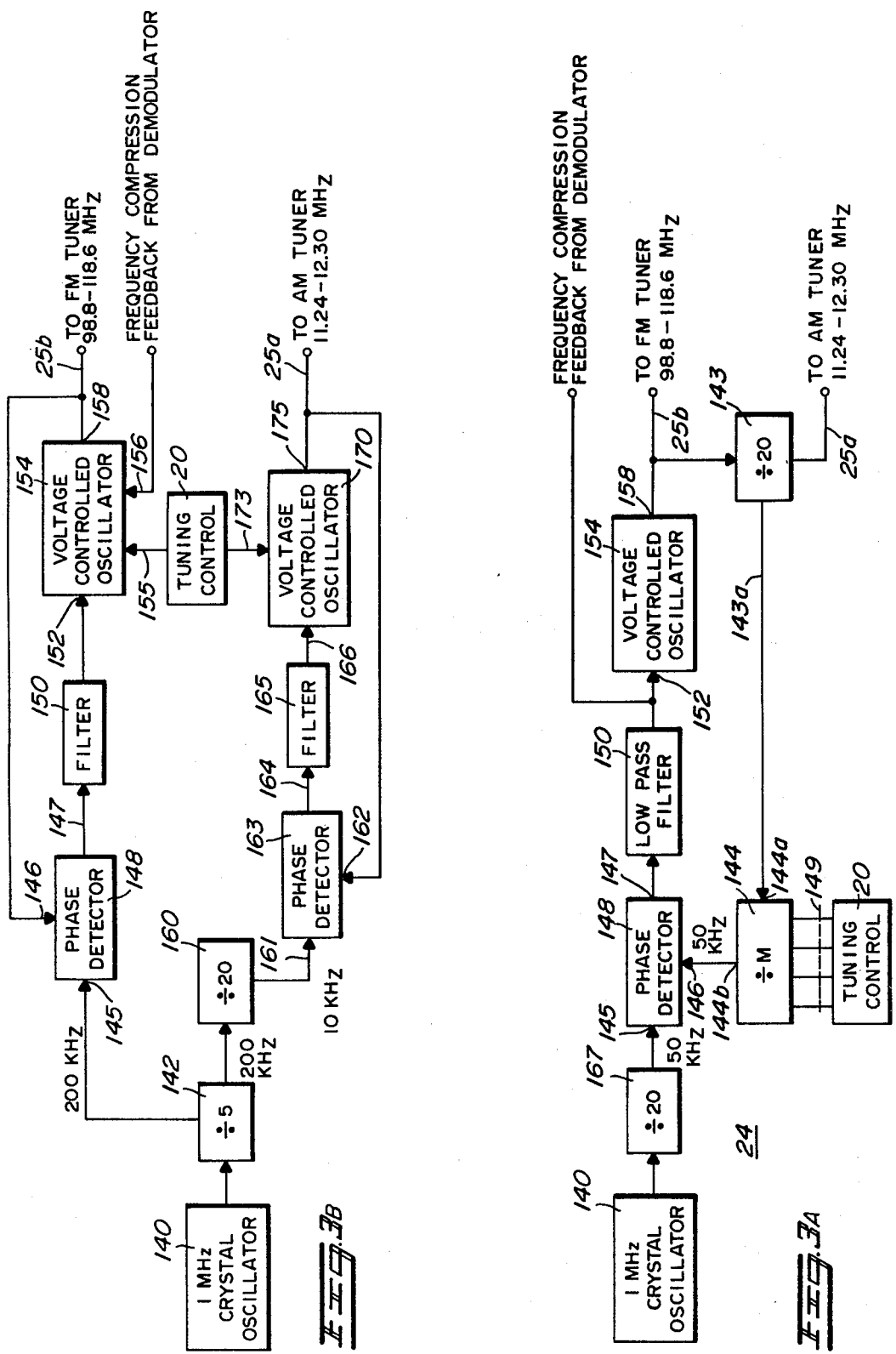
FIG. 3A is a detailed block diagram of the synthesizer.
FIG. 3B is a detailed block diagram of an alternative synthesizer.

A synthesizer 24, discussed more fully with reference to FIG. 3, connects to mixers located within each front end. Line 25 connects the synthesizer 24 to the FM front end at terminal 26, and to the AM front end at terminal 27. The synthesizer 24 is a tunable oscillator, which derives its tuning signal from the tuning control 20 at synthesizer input terminal 29. In response to signals from the tuning control 20, the synthesizer 24 produces signals of predetermined frequency which, when mixed with the front end signals, produce an output at each front end 16, 18 centered at a single intermediate frequency. In the preferred embodiment, the synthesizer 24 signal translates the FM front end signals to 10.7 MHz, the resultant signal appearing at the FM front end output terminal 31, and, similarly, translates the AM front end signals to the same intermediate frequency, i.e. 10.7 MHz, the resultant signal appearing at the AM front end output terminal 32.

While the preferred embodiment illustrates only two front ends, it should be understood that any number of front ends could be used. Other desirable front end bands might include short wave, weather information, long wave and the like. Further, while the preferred embodiment converts each front end to the same IF frequency, it should be understood that an embodiment which up-converts the AM band to obtain the image rejection benefits described hereinbelow also falls within the scope of the invention even if a common IF is not used. Moreover, while the preferred embodiment employs a crystal stabilized synthesizer to produce the local oscillator frequencies, it should be understood that a device according to the instant invention might use conventional local oscillator circuitry.

As the front end outputs are all at a single predetermined intermediate frequency, each may be processed through a common IF stage 36. The IF stage contains filters, centered about the intermediate frequency, which provide tuning selectivity. Also, a common IF amplifier is used for all input signals. In addition, in applications wherein another local oscillator stabilization technique is desired, e.g. conventional local oscillator designs, the common IF could include a crystal discriminator, centered at the IF, which produces an output feedback signal at output terminal 41 coupling to the synthesizer at the synthesizer terminal 42. This feedback assures that the synthesizer translates the front end signals to precisely the predetermined intermediate frequency. The common IF 36 provides a first output for AM signals at 43 and a second output for FM signals at 44. These outputs 43, 44 are applied to a common phase lock loop FM/AM demodulator 50. The demodulator 50, which is more fully described with reference to FIG. 5, acts in one mode to decode FM signals, reproducing them at the FM demodulator output terminal 52. In a second mode it demodulates the AM signals reproducing these signals at the AM demodulator output 53. In addition, the demodulator provides an output AGC signal at AGC output 55 which is fed back both to the AM front end at terminal 56 and to the common IF AGC terminal 57. This feedback signal controls an attenuator located within the AM front end which acts to limit the signal amplitude applied to the front end mixer, and similarly controls an attenuator located in the common IF. Similarly a demodulator 50 output on line 107 provides an AGC control signal to the FM tuner AGC input 58. Also, a signal is produced at the demodulator output 61 which is applied to the synthesizer input 62 whereby frequency compression is achieved, as is more fully described hereinbelow.

Electronic switches located within the demodulator 50, which are used to select either the AM or FM mode of demodulation, are controlled at the demodulator input 66 by the panel switches indicated generally at 70. The panel switches are manually operable from the front of the radio receiver. In the instant embodiment, the switches allow a radio user to select either the AM or FM band, to select a pre-programmed tuning frequency, to actuate a tuning scan mode, to adjust the setting of an internal clock, and to turn the radio on or off.

The FM output terminal 52 of the demodulator couples to the input 71 of a stereo demodulator 73. In a well known manner, the stereo demodulator 73 decodes the stereo FM signal and produces a left channel output at terminal 74 and a right channel output at terminal 75. These channels, along with an audio signal from an auxiliary source 76, and the audio outputs from a stereo tape deck 79, all feed into an audio source selector 80. The source selector 80 is comprised of a series of electronic switches, all of which are controlled via signals from the panel switches 70 to the source selector control terminal 82.

The source selector 80 routes selected audio inputs to the audio processor 88. The processor includes internal circuitry which varies the amplitude and frequency characteristics of input signals in response to DC control voltages applied at the processor inputs 91, 92 and 93. The control signal inputs originate at the front panel controls 94 which, as shown, are operable to set volume, tone, and balance. These panel controls are connected to a pushbutton to analog translator 96 which in turn provides DC control voltages at processor inputs 91, 92 and 93 suitable for achieving the required amplitude, balance, and tone processing. In an alternative embodiment the panel controls 94 may comprise controls having a direct analog output, e.g. potentiometers, thus obviating the need for translator 96. Thereafter, the audio signals couple to left and right drivers 98, 99 respectively; the drivers couple to power amplifiers 102, 103 and thereafter the signals are transduced to audibility via speakers 105, 106 respectively.

A display control 110 produces at a read out 112 a digital display representative of a parameter status such as the frequency to which the radio is tuned. The display control 110 is comprised of processing circuitry and readout driver circuitry. An input signal to the control 110, for example an input from tuning control 20, is selected from panel switch grouping 70 and is predeterminedly scaled and processed to activate selected readout drivers, which drivers in turn activate corresponding segments of the readout. In the preferred embodiment the readouts are of the seven segment light emitting diode type, but it should be understood that other types, such as liquid crystal, or plasma discharge devices may be used. Such display and display control circuitry is well known in the art, as, for example, in digital voltmeter applications. The display control 110 may be provided with switching to allow an auxiliary display input 114, such as an electronic clock, to be fed into the display control thereby reading out the input parameter, such as time, on the digital display 112. Where the synthesizer 24 utilizes a high stability crystal oscillator, the oscillator output can be used as the time base for the clock, thus providing extreme timing accuracy. For the preferred embodiment wherein the auxiliary input is a clock, the oscillator output 63 is shown coupled to the auxiliary input 65. Also, the display control might sense the status of a tape player, whereby the readout might indicate the track number of the tape being played.

As can be seen, the overall universal electronic radio-entertainment center is of a very flexible design, allowing countless inputs, outputs, and display modes. Further, since virtually all radio functions are realized by all electronic circuitry, a unique radio mechanical construction is employed. The radio is comprised of a chassis or "mother board", having module receiving connectors interconnected corresponding to given radio functions. Selected circuits are fabricated on plug-in "sister board", modules. These modules may be individually tested and aligned. Thus, it is seen that the basic radio may be altered, or repaired, simply by replacing a given module. For example, altering a radio designed to operate in the U.S. AM band for operation in a European band would simply require replacing certain modules with their European counterparts. A further advantage to the all-electronic design is that componentry may be in integrated circuit form and thus the radio can be fabricated in a very small volume, yet being highly reliable in use.

Figure 2:
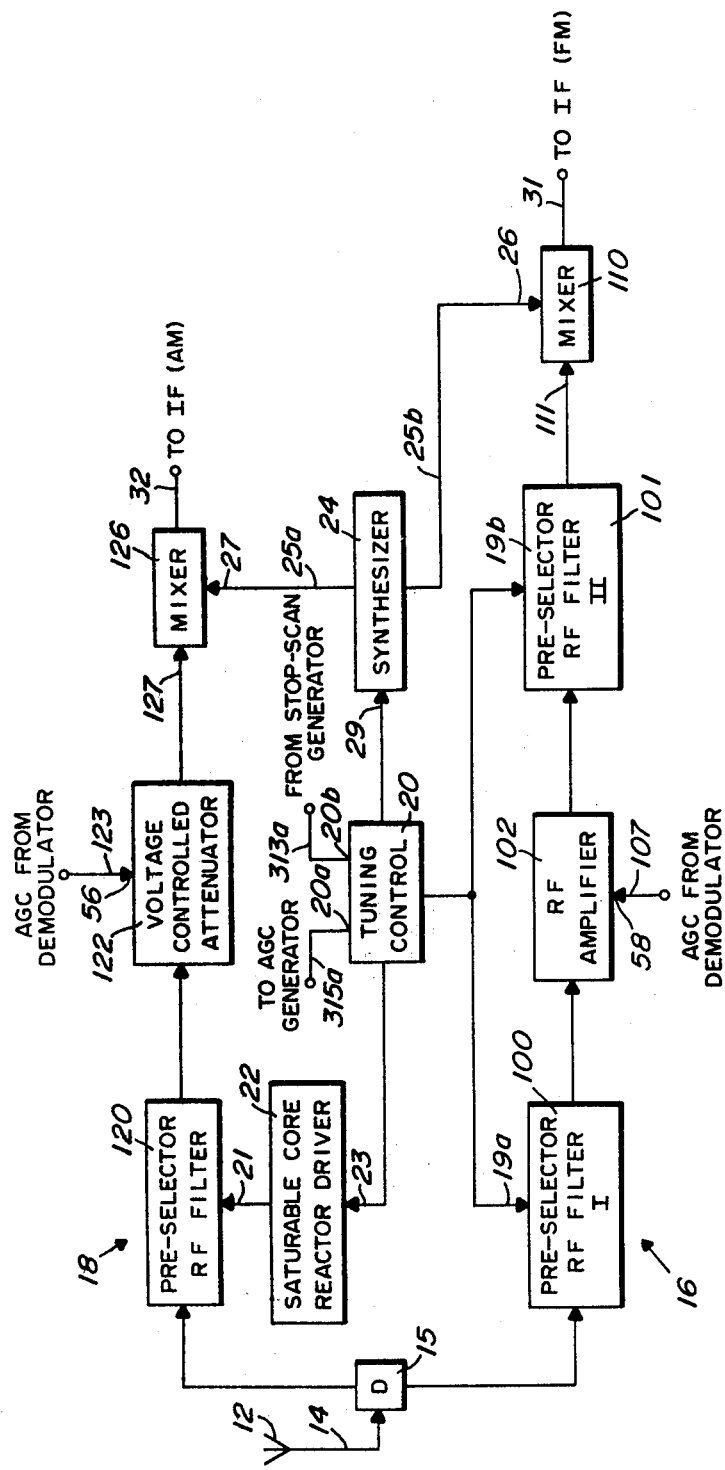
FIG. 2 is a detailed block diagram of the AM and FM front ends.

FIG. 2 illustrates the elements of the tuner of the universal electronic radio. RF signals received at antenna 12 are passed via line 14 to the diplexer 15. The diplexer 15 separates AM from FM signals, passing the FM signals to the FM tuner 16, and the AM signals to the AM tuner 18. The FM front end 16 has a pair of RF filters 100, 101. Each filter is comprised of a reverse biased silicon diode whose tuning capacitance varies predeterminedly in response to a tuning signal applied at the preselector filter terminals 19a, 19b, respectively, from the tuning control 20. The filters act to pass selected frequencies to subsequent radio circuitry. The output of the first preselector RF filter 100 passes to an RF amplifier 102. The RF amplifier 102 is of conventional design, having an AGC input terminal 58 fed via line 107. Variable voltages at the AGC input 58 alter the gain characteristics of the amplifier 102, whereby the dynamic range of signals applied to the mixer 110 is kept within the mixer's normal range. Further selection is accomplished by the second filter 101, and, thereafter the signal is passed to the first input 111 of the mixer 110. The mixer has a second input 26 which connects to the synthesizer 24 output via line 25b. In response to signals from the tuning control 20 applied to synthesizer input 29 the synthesizer produces a signal of predetermined frequency which is suitable for translating the FM selected frequency to a common IF, in this case 10.7 MHz. The mixer output, at 31, leads to the common IF amplifier of the radio.

In the preferred embodiment, the FM mixer 110 is comprised of a MOSFET, having first and second gates, a drain, and a source. Coupled to the first gate is the output from the second RF filter 101, available at input 111. The synthesizer 24 via line 25b couples to the second gate at terminal 26, and the drain couples to the line output 31. The MOSFET's source is coupled to a reference potential. It is known in the art that MOSFETs are excellent mixers, having a wide dynamic range input and providing controlled mixing at the output.

AM signals couple directly from the diplexer 15 to the AM RF filter 120. The filter 120 is comprised of a saturable core reactor whose tuning inductance varies as a function of the current signal provided to it, at the filter input terminal 21, from the saturable core reactor driver 22. The output from the tuning control 20 is a DC voltage which is not suitable for the proper driving of the reactors. Therefore, the reactor driver 22 takes the DC voltage from the tuning control 20, at driver input 23, converting it to a corresponding DC current suitable for reactor tuning. Selected frequencies in the AM band are passed from the AM RF filter 120 to a voltage controlled attenuator 122. AGC voltages, from the AM demodulator, on attenuator 122 AGC input line 123 at terminal 56 vary the degree of attenuation of the attenuator 122 whereby the AM mixer 126, which couples to the voltage controlled attenuator output, is not overloaded. The AM mixer 126 employs an FET having a gate, a source, and a drain. The gate couples to the voltage controlled attenuator output at terminal 127, the source couples to the synthesizer 24 via mixer input 27, and the drain couples to the mixer output on line 32. Signals from the synthesizer respond to tuning control signals whereby the selected AM signals applied to the mixer first input 127 are translated to the common IF frequency, namely 10.7 MHz. As is known in the art, an FET mixer accepts wide dynamic range input signals producing a controlled mixed output.

Unlike conventional radios, there is no RF amplification of the AM signals prior to the mixer. Further, preselector RF filter 120 does not have the narrow band pass normally associated with AM front end filters. Because radio selectivity is primarily determined by later circuits, front end circuitry in the universal electronic radio is not as critical as in standard designs.

The tuning control 20 has several modes of operation. First, it is responsive to panel switches whereby depression of a panel switch causes the tuning control to vary its output tuning signals thus tuning the receiver to different frequencies. Further, the tuning control has the capability of storing programmed tuning signals whereby the radio user may simply push a button which he has programmed to correspond to a selected radio station, and the tuner automatically recalls the proper tuning signal from its memory, applying the signal to the appropriate RF front end.

In the manual scan mode, the operator depresses a control and the radio automatically scans the frequencies in the band until it sequences to the desired received station, at which time the control is released, and the radio locks to the desired station. In an automatic scan mode the control is manually activated once and the tuner automatically tunes and locks the radio to a subsequently received station.

When tuning is instituted the AGC circuitry, described with reference to FIG. 5, must be disabled. Therefore, tuning control 20 produces an AGC disable pulse at output 20a, which is coupled to the AGC generator, at the beginning of a tuning sequence.

A stop scan generator, which is also discussed with reference to FIG. 5, senses that a station is received and transmits a stop pulse to tuning control input 20b, via line 313a, which causes the tuning control to cease sequencing, thus locking the radio onto the frequency of the received station.

The tuning control 20, and preferably the synthesizer 24, are fabricated in integrated circuit form. The control 20 contains addressable storage registers which, via control 20 internal switching, allow user programming. The digital stored information corresponds to the analogue voltage which, when applied to the synthesizer 24 and front ends 16, 18 automatically tunes the radio to the prepregrammed stations. Digital-to-analogue conversion is accomplished via any suitable digital-to-analogue converter known in the prior art. The control 20 includes further circuitry responsive to front panel switches which cause a discrete increase (or decrease, depending upon whether the up-scan or down-scan button is depressed) analogue output voltage sequencing the synthesizer and the front ends to an adjacent station. Such circuitry may be realized by conventional up-down counters and digital-to-analogue converters well known in the prior art. While the tuning control 20 is complex to build, it should be appreciated that one skilled in the art has sufficient knowledge to build such circuitry which switch and store digital signals, thereafter converting them to a desired analogue voltage.

FIG. 3A illustrates the preferred embodiment of the synthesizer 24. A crystal oscillator 140 produces output pulses at a 1 MHz rate stable to within ±0.002%. These pulses contain harmonics of the fundamental 1 MHz frequency. A divider 167 divides the oscillator output by twenty, applying the resultant 50 Khz and its harmonic signals to input 145 of phase detector 148. Phase detector 148 has a pair of inputs 145, 146 and a controlled output 147. Internal circuitry in phase detector 148 causes its output 147 to assume a DC voltage representative of the phase difference between signals applied to the inputs 145, 146. Phase detector output 147 couples to a low pass filter 150 which removes any high frequency components from the phase detector output, thereafter passing the filtered DC signal to input 152 of the voltage controlled oscillator 154. Internal circuitry in controlled oscillator 154 causes its output oscillating frequency to vary in response to the DC voltage at its input 152. Also coupled to oscillator input 152 is a frequency compression feedback signal, which is more fully discussed hereafter. The voltage controlled oscillator output 158 couples to line 25b which connects to the FM mixer portion of the FM tuner.

Voltage controlled oscillator output 158 also couples to the input of a second divider 143. This divider divides signals at its input by a factor of twenty reproducing the output at a first line 25a which couples to the AM mixer portion of the AM tuner, and at a second line 143a which connects to the input 144a of a programmable divider 144. Programmable divider 144 has a series of control inputs which couple via lines 149 to tuning control 20. Divider output 144b connects to the phase detector 148 second input 146. Programmable divider 144, via internal circuitry, acts to reproduce at its output 144b the signal at its input 144a divided in frequency by a modulus M. The modulus M is programmable via binary coded decimal signals applied from the tuner 20 via lines 149 to the divider's control input terminals.

Phase detector 148, low pass filter 150, voltage controlled oscillator 154, divider 143, and programmable divider 144 act as a conventional phase lock loop. Phase detector 148 produces a DC voltage at its output 147 which represents the error in phase lock between the crystal divided signal at its first input 145, and the return loop signal at its second input 146. This DC error voltage is filtered by low pass filter 150, thereafter being applied to voltage controlled oscillator control terminal 152. In response to the DC voltage at its input 152, the voltage controlled oscillator internal circuitry varies the frequency of oscillation at its output 158. This output frequency is then divided first by divider 143 and then by divider 144 being applied back at the phase detector second input 146. The loop feedback will assure that the phase detector's first and second inputs 145, 146 ultimately phase lock, assuring that the frequency at second input 146 equals a multiple of the divided crystal oscillator frequency. Since the frequency on line 25b is equal to the frequency at phase detector second input 146 times (20×M), it is apparent that by changing the modulus M, a predetermined frequency may be selected on line 25b. The produced frequency sequences in selected multiples of 50 Khz increments, responsive to the changing modulus, in order to satisfy the properties of the phase lock loop.

Since the FM band ranges from 88 to 108 MHz, with interstation spacings of 200 Khz, the synthesizer 24 must produce output frequencies tunable over a range of 98.8 to 118.6 MHz, in 200 Khz increments, to properly translate the FM band signals to the predetermined IF frequency of 10.7 MHz. Thus, the voltage controlled oscillator 154 is designed to nominally operate in the 100 MHz range. In response to binary coded decimal tuning control signals the programmable divider 144 alters its modulus M whereby the frequencies at output line 25b are caused to jump in the required 200 Khz increments over the desired FM band range. In this manner, the synthesizer produces discrete frequency outputs, each of which is at a proper spacing to tune the receiver to authorized FM stations.

As the AM broadcast band is from 535 to 1605 Khz, with interstation spacing of 10 Khz, the Am synthesizer output must be tunable over a range from about 11.24 to 12.30 MHz to properly translate the AM base band to the predetermined IF frequency of 10.7 MHz. As described above, the output line 25b, in response to a changing modulus M of divider 144, jumps in 200 Khz increments. These 200 Khz increments are divided by twenty by divider 143 resulting in 10 Khz increments on line 25a, which are suitable for the AM interstation spacings. Thus in the AM mode the tuning control 20 programs programmable divider 144 whereby frequencies over the desired range are selected in precise b 10 Khz increments.

FIG. 3B illustrates, in fundamental building block form, an alternative embodiment of synthesizer 24. A crystal oscillator 140 produces output pulses at a 1 MHz rate stable within ±0.002%. These pulses contain harmonics of the fundamental 1 MHz frequency. A first divider 142 divides the crystal output by 5, applying the resultant 200 Khz fundamental signal, and its harmonics, to the FM phase lock loop phase detector input 145. The FM phase lock loop contains a phase detector 148 having a first input 145, a second input 146, and an output 147. Internal circuitry in the phase detector 148 causes its output 147 to assume a DC voltage representative of the phase difference between signals applied to the inputs 145, 146. The phase detector 148 couples to a low pass filter 150 which removes any high frequency components from the phase detector output, thereafter passing the filtered DC signal to an input 152 of the voltage controlled oscillator 154. The voltage controlled oscillator 154 has a series of inputs 152, 155 and 156, each of which is coupled to the oscillator's internal circuitry whereby a signal at an input varies the frequency of the oscillator signal at the output 158. The oscillator output 158 couples back to the phase detector second input 146. Applied to oscillator input 155 is the output from the tuning control 20. Applied to voltage controlled oscillator input 156 is a frequency compression feedback signal from the demodulator, which is more fully described hereafter.

Phase detector 148, filter 150, and voltage controlled oscillator 154 act in the above described phase lock loop manner whereby controlled oscillator output 158 is DC controlled via phase detector 148 thorugh filter 150 such that its output frequency jumps in discrete intervals to phase lock with the crystal derived signal at phase detector first input 145. Since the crystal drive frequency is 200 Khz and its harmonics, the output on line 25b will jump in 200 Khz increments, which is the precise increment for proper FM tuning. Tuning control 20 applies a DC signal to voltage controlled oscillator input 155 whereby the oscillator output at 158 may step up or down in the desired increments over the preselected FM range.

The output from the divide by 5 first divider 142 couples to a second divider 160. The second divider divides input signals by 20 whereby the divider output is at 10 Khz, and its harmonics. These signals are in turn fed to the first input 161 of AM phase detector 163 which has a second input 162 and an output 164. The output feeds a low pass filter 165 which in turn feeds one of the voltage control inputs 166 of a voltage controlled oscillator 170. The voltage control output is at 175, this output being fed back to the phase detector second input 162.

The AM phase lock loop synthesizer works in a similar manner as the FM, the only difference being that the AM loop is tunable via line 173 from tuning control 20 in discrete steps of 10 Khz across the desired synthesizer output which appears on 25a.

It should be clear that either the preferred or alternate synthesizer may be modified to produce any desired mixing frequencies having any selected spacing increment, and thus, each is suitable to tune bands other than the AM/FM bands of the preferred radio embodiment. Moreover, because the stability of the synthesizer's output frequencies is dependent on the stability of the crystal, no AFC voltage need be derived as in prior art tuners. Thus the feedback from output 41 of the common IF 36 to input 42 of synthesizer 24, as illustrated in FIG. 1, is not required in the preferred embodiment employing a highly stable crystal controlled synthesizer.

An additional advantage of the embodiments of the synthesizer is that frequency compression feedback may be employed in the FM mode. Frequency compression feedback is a technique whereby the recovered base band information of a signal is fed back to, and FM modulates, the mixing frequency. This feedback is shown in FIG. 3A as applied to voltage controlled oscillator input 152, and in FIG. 3B as applied to voltage controlled oscillator 156. The resultant mixing frequency, when applied to the FM mixer, results in a reduced bandwidth signal at the mixer output since as the received RF signal increases in frequency deviation, the mixing frequency correspondingly increases. The reduced bandwidth mixer output allows a narrower bandpass in the IF filter. In conventional IF designs, the bandwidth is given as $2(\Delta f + f_m)$, where $\Delta f$ is the maximum deviation and $f_m$ is the maximum modulating frequency. For stereo broadcast $\Delta f = 75$ Khz and $f_m = 53$ Khz. Thus, a conventional IF bandwidth is approximately 256 Khz. By using frequency compression feedback, the IF bandpass may be reduced to $2 \times f_m = 106$ Khz. A decrease in IF bandwidth results in a corresponding decrease in noise power. By reducing the noise a corresponding decrease in receiver threshold is realized. Threshold is that point at which the received signal's carrier can be distinguished above the noise level. Thus, by using frequency compression feedback the decreased threshold may be calculated:

Improved threshold in db = $10 \log_{10} (256/106) \approx 3.8$ db. With monophonic broadcast FM signals a further improvement in receiver threshold is possible because the base bandwidth is only 15 KHz.

Figure 4:
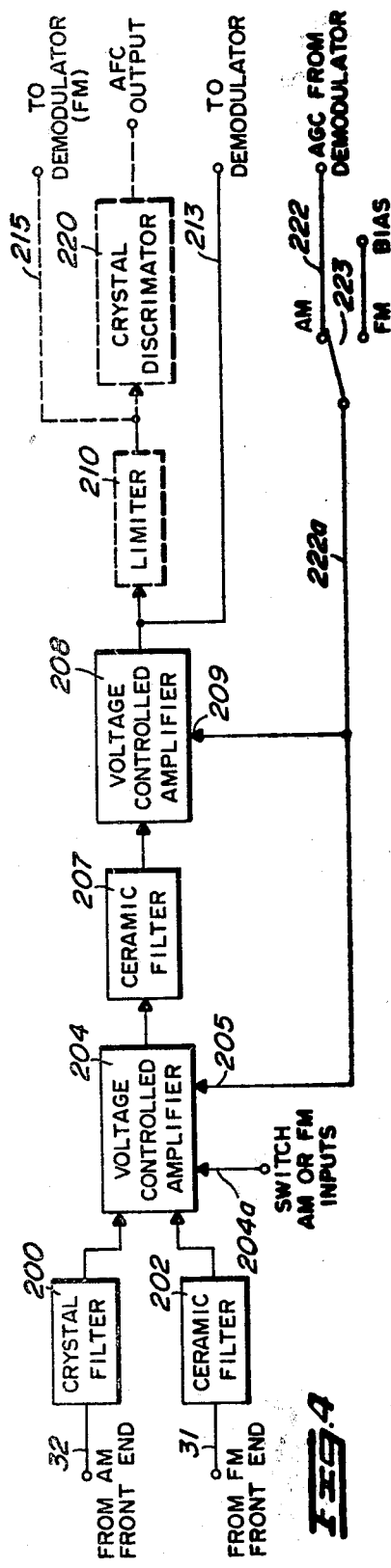
FIG. 4 is a detailed block diagram of the IF stage showing the common IF amplifier.

The output from the AM and FM front ends are fed to the IF section illustrated in FIG. 4. The AM mixer output 32 feeds to a crystal filter 200. The FM front end output 31 feeds to a ceramic filter 202. The outputs from the two filters 200, 202 are fed to a common IF amplifier 204 whose amplification is voltage controlled via voltage applied at a control terminal 205, via line 222a. A switch (not shown) internal to amplifier 204 is responsive to bandswitch signals on line 204a to selectively amplify and pass either the AM or FM input. The amplifier 204 output feeds to a ceramic filter 207 which in turn feeds to a second voltage controlled amplifier 208 also having a voltage control terminal 209 fed from line 222a.

Line 222a connects to the movable contact of a switch 223. Switch 223 is ganged with other band switches whereby in the AM mode line 222a connects to line 222, which is the AGC output from the demodulator, and in the FM mode line 222a connects to a bias potential. The bias potential is selected to operate the controlled amplifiers 204, 208 at maximum gain, whereby limiting of the FM signal is achieved. In the AM mode, however, AGC voltages from the demodulator maintain the controlled amplifiers 204, 208 in a linear range.

In an alternative embodiment, (shown in dashed lines), the output from the amplifier 208 feeds to limiter circuitry 210 and also to the AM demodulator via line 213. The limiter 210 acts to amplify and square input signals, thus providing an output at line 215 to the FM demodulator. The limiter 210 output is also shown feedng crystal discriminator 220 whose output is fed back to the voltage controlled oscillators (not shown) of the synthesizer 24. Due to the stability and accuracy of the crystal controlled synthesizer as used in the preferred embodiment, the discriminator is not required. However, in less stable synthesizer designs, or if conventional local oscillators are used, limiter 210 and discriminator 220 might provide improved circuit performance.

IF section operation is as follows. The crystal filter 200 has a very narrow pass band centered about the intermediate frequency, i.e. 10.7 MHz, which provides extensive AM selectivity. The selected AM signals are amplified in the amplifier 204, further filtered in the filter 207, and further amplified in amplifier 208 whereafter they are passed to the demodulator via line 213. Line 222 from the demodulator provides an automatic gain control signal which operates to keep the voltage controlled amplifiers 204, 208 in an amplification range whereby the AM signals are not distorted.

FM selectivity is accomplished through the action of ceramic filter 202, whose output is fed through the same amplifier 204, the same ceramic filter 207, and the same second amplifier 208, as was the AM signal. Since the fixed bias switched to line 222a, via switch 223, operates the amplifiers 204, 208 at maximum gain, FM limiting occurs.

By translating all front end signals to a common IF frequency it is seen that savings may be accomplished by utilizing common filters and amplifiers. Also by translating the AM band up to a high IF frequency, the receiver's AM image rejection is improved.

An image is an unwanted frequency component received at the tuner's front end which is mixed to the same IF frequency as the desired signal. It can be shown that such an image is at a frequency twice the intermediate frequency removed from the desired RF signal. In conventional AM receivers, the AM pass band is translated to an IF frequency of 262.5 Khz. If, for example, the AM front end were tuned to 670 Khz, a local oscillator frequency of 932.5 Khz would produce the desired 262.5 Khz IF frequency. In addition, the local oscillator frequency would translate a received signal at 1195 Khz, which is still within the AM band, to the same IF frequency, thus creating detrimental interference with the desired signal. If a 10.7 Mhz translating frequency were used in the above example, a received interfering image would be at approximately 22.07 MHz. This signal would be well beyond the AM pass band, and would be attenuated by the preselection of the tuner to an extent that it would be negligible.

While all front end signals are translated to a single IF in the preferred embodiment, it should be understood that a radio according to the instant invention might employ a plurality of IF sections. A significant advantage is realized by up-converting the AM to any frequency by a translating frequency which is substantially greater than the frequency which is conventionally used to down-convert the AM. As described above, using a large translating frequency provides additional image rejection, and, thus, an improvement in the recovered AM signal. It is recommended, that, to realize the superior image rejection of an AM receiver according to the invention, the standard AM band of from 535–1605 Khz be translated by a modulating frequency to at least 7 MHz. The IF frequency of 10.7 MHz was chosen for the preferred embodiment since no potentially interfering broadcasing is allowed on this frequency.

The IF AM and FM output line 213 is fed to the demodulator, which is illustrated in FIG. 5. In the AM mode, IF signals on line 213 are routed first to an amplitude limiter 265, and thereafter to the first input 268 of a phase detector 270 which has a second input 269 and an output 279. The phase detector input 269 connects to the output 271 of a voltage controlled oscillator 278. The oscillator 278 has free running oscillator input terminals 273, 274, and a DC control terminal 275. A band switch 276, ganged with a switch 277, and switch 223 (FIG. 4), connects an AM loop amplifier 280 between the oscillator control terminal 275 and the phase detector output 279 in the AM mode, and an FM low pass filter 281 between these terminals in the FM mode. The switch 277 connects either a crystal 290 or an RC time constant circuit 292 between the free running oscillator terminals 273, 274 dependent upon whether the band switch is in the AM, or FM position, respectively. The voltage controlled oscillator output 271 connects to a 90° phase shift circuit 295 which then feeds to the first input 301 of a coherent detector 300. The detector's second input 302 connects to the input IF signal. Acting in the conventional manner, the coherent detector 300 demodulates the AM signal to base band via the injected phase locked carrier at input 301. The coherent detector output 308 feeds first to a first low pass filter 309 which in turn feeds an AGC generator 315 producing AGC control voltage on line outputs 222, 123, second to a second filter 310 whose output is the recovered audio which thereafter is fed to the AM audio input via line 312, and third to a stop scan pulse generator 313.

In the FM mode, IF signals on line 213 are limited by limiter 265 and applied to the first input, 268, of the phase detector 270. The FM detected output is taken at the voltage controlled oscillator 278 side of the FM loop filter, which thereafter feeds to a stereo decoder 73, to frequency compression feedback line 61, and to pulse generator 313. The stereo decoder has left channel and right channel outputs 74, 75 respectively, which feed to the audio inputs of the audio source selector.

Demodulator operation is understood as follows. For AM input signals, the entire AM IF signal is fed to one input 302 of the coherent detector 300. The voltage controlled oscillator 278 has the crystal 290 controlling its free running frequency, thus providing a very stable mode of oscillation at or near the intermediate frequency. The phase detector, voltage controlled oscillator, and AM loop amplifier cause the oscillator output 271 to phase lock to the IF frequency, thus reconstructing the broadcast carrier. This carrier is phase shifted 90° by the shifter 295 for proper injection to the coherent detector 300. Operating in a well known manner, the coherent detector demodulates the IF AM signal to base band via the injected carrier. Several advantages can be gained over prior art envelope type detectors with the combination phase lock loop inject carrier and coherent detector. First, the resultant recovered signal is more stable during multipath conditions. Second, a decrease in noise of the recovered audio signal can be achieved. Third, the coherent detector is more linear than conventional detectors, thus yielding a lower distortion output. Also, in low signal conditions noise output from the detector is additive and not multiplicative to the recovered signal as in other systems, thus making the character of the received signal more pleasing to hear. Further, in small signal conditions where the carrier is prone to drop out, the phase lock loop injection scheme provides carrier "fill-in".

An increasing recovered audio signal from the detector 300 produces an increased signal from the output of filter 309, and thus, an increased control output signal from AGC generator 315 at line outputs 222, 123, which outputs gain reduce the IF voltage controlled amplifiers and front end attenuator. AGC generator 315 contains an integrator, such as a capacitor, which charges to a DC level representative of the magnitude of the recovered audio out of the coherent detector 300. Because radio tuning occurs rapidly, it is imperative that the integrator capacitor be discharged simultaneously with a tuning change. A pulse from the tuning control couples via line 315a to an AGC generator input whereby the AGC is disabled during the tuning mode. The stop-scan pulse generator 313 couples via line 313a to the tuning control. Contained within the stop-scan pulse generator 313 is a voltage reference which is compared with the average DC level of the recovered audio signal level. If the reference voltage is greater than the audio voltage, the pulse generator output line 313a remains mute, and the tuner sequences to a subsequent station. When the recovered audio average level exceeds the internal reference, a pulse is produced which signals the tuning control that a station is being received and that tuning should cease. AGC action tends to maintain the recovered audio signal at filter terminal output 312 at a constant level.

In the FM mode, the FM signal is fed through the limiter 265 to the phase detector 270. Due to the increased deviation in FM signals, the free running frequency of the local oscillator, as now determined by the network 292, is more easily "pulled". As the phase detector 270 constantly tries to lock to the input FM IF frequency, the voltage at the voltage controlled output 275 will in fact be the demodulated base band information. Such phase lock loop FM demodulator techniques are well known in the art, and are recognized as extending the FM threshold as well as producing a lower distortion output. This information is fed to the conventional stereo decoder 73 which produces a left output 74 and a right output 75. Also, the FM demodulated output at terminal 61 provides a frequency compression feedback signal to the synthesizer, which is more fully discussed with reference to FIGS. 3A, 3B. In addition, the recovered FM is fed to the stop-scan pulse generator 313, which produces stop pulses in response to minimum acceptable audio signals as in the similar manner as for AM signals.

Figure 6:
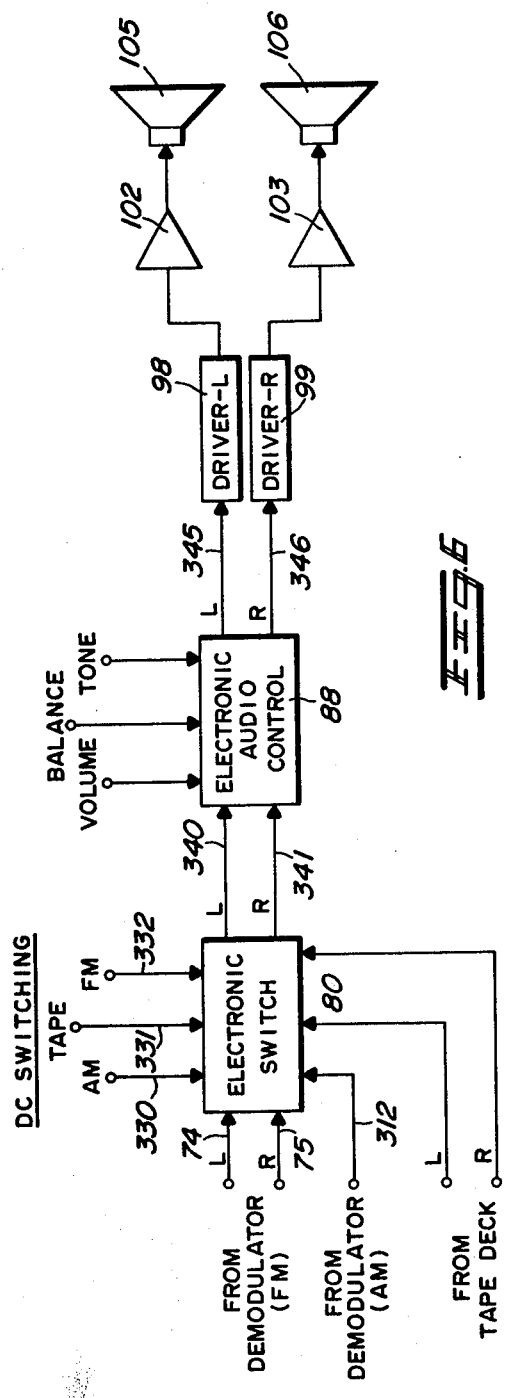
FIG. 6 is a detailed block diagram of the audio reproducing circuitry.

The left and right FM demodulated outputs 74, 75 respectively are fed to two of a plurality of inputs of an electronic switch source selector 80, as is shown in FIG. 6. Also, the AM demodulated output via line 312 is fed to one of the switch 80 inputs, as are the left and right outputs from a tape deck (not shown) which may be included within the electronic entertainment system. The switch 80 has a plurality of DC control inputs 330, 331, and 332. These inputs couple to panel selector switches (shown in FIG. 1), and when a reproduction mode, such as AM, is selected, an input signal is applied to a line 330-332 activating the electronic switch 80 whereby the selected input is routed to the electronic switch outputs 340 and 341. For example, when the FM mode is selected, a signal on line 332 activates the electronic switch 80 whereby the input lines 74, 75 are electronically switched to the corresponding outputs 340, 341.

The switch outputs 340, 341 couple to an electronic audio control 88. This control is responsive to DC signals applied via panel controls 94 (shown in FIG. 1) whereby the amplitude, tone, and balance of the channels are altered responsive to a change in the DC controls applied. Numerous DC controlled volume and tone systems are available, an example of which is U.S. Pat. No. 3,875,334 issued to Filliman and Hilbert, assigned to the same assignee as the instant invention. The resulting amplitude and tone shaped signals feed through output lines 345, 346 to the audio drivers 98, 99 which in turn, feed to the power amplifiers 102, 103, respectively. Amplifiers 98, 99 drive the speakers 105, 106, which thereby transduce the electrical signals to audibility.

Electronic switch 80 may be adapted to accept any number of input signals. Also, since the electronic audio control 88 is responsive to purely DC signals, the volume, balance, and tone controls may be located at a remote distance from the chassis of the radio receiver without degradation in the audio quality.

In summary, a universal electronic radio has been disclosed which consumes a minimum of space yet provides superior performance by drawing on state-of-the-art technology. Moreover, the design concept allows the entire radio to be fabricated on plug in modules adapted to be received within chassis connectors, thus rendering a readily repairable and alterable radio.

While a preferred embodiment of the present invention has been disclosed, many variations thereto are possible, all of which fall within the true spirit and scope of the invention.

I claim:
1. A radio/clock combination comprising:
   a radio which produces an output signal representative of the frequency to which the radio is tuned, and
   a clock which produces an output signal representative of the time of day,
   wherein the improvement comprises:
   control means selecting either the radio output or clock output signal including means for predeterminedly scaling and processing the selected signal to activate selected readout drivers,
   readout devices coupled to corresponding drivers which, when activated, produce a desired display,
   oscillator means producing an output signal of predetermined frequency,
   means processing the oscillator output signal to tune the radio, and
   means processing the oscillator output signal to activate the clock,
   whereby the readout selectively displays either the frequency to which the radio is tuned or the time of day.

2. The combination of claim 1 wherein the oscillator is crystal controlled.

3. The combination of claim 1 wherein the display is a digital display.

4. In a radio/clock combination wherein radio tuning is accomplished by varying of a tuning signal and wherein the time of day is derived from a predetermined time base signal, the improvement comprising:
   oscillator means for producing a predetermined frequency signal;
   tuning means for predeterminedly processing said oscillator produced signal to provide the radio tuning signal;
   timing means for predeterminedly processing said oscillator produced signal to provide the time base signal;
   digital display means for displaying a sequence of digits; and
   display control means for selectively sensing the tuning of the radio or the time of the clock and, in response thereto, driving said digital display means for displaying only the corresponding one of the frequency to which the radio is tuned and the time of day.

5. In a radio/clock combination:
   oscillator means for generating an oscillator signal;
   tuning means coupled to said oscillator means for receiving and processing said oscillator signal and developing a signal for tuning the radio;
   clock means coupled to said oscillator means for receiving and processing said oscillator signal and developing at least one signal indicative of the time of day;
   digital display means for displaying a sequence of digits adapted for displaying either the time of day or the frequency to which the radio is tuned; and
   manual control means coupled to said tuning, clock and digital display means for selecting, and causing said display means to indicate, only one of either the time of day or the frequency to which the radio is tuned.

6. In a radio device, the combination including:

first circuit means for generating a substantially fixed frequency oscillator signal;

second circuit means coupled to said first circuit means for receiving and processing said fixed frequency oscillator signal and developing an adjustable frequency signal for tuning the radio;

third circuit means coupled to said first circuit means for receiving said fixed frequency oscillator signal and developing in response thereto at least one signal indicative of information other than the frequency to which the radio device is tuned;

fourth means coupled to said third circuit means for receiving said at least one indicative signal and displaying said information, wherein said fourth means is adapted for visually displaying either the frequency to which the radio is tuned or said information; and control means coupled to said second circuit, third circuit and fourth means for selecting and causing said fourth means to indicate only one of either the frequency to which the radio is tuned or said information.

7. The radio device combination as recited in claim 6 wherein said fourth means provides a visual display.

8. The radio device combination as recited in claim 7 which includes an R.F. tuning mixer stage which receives said adjustable frequency signal.

9. The radio device combination as recited in claim 8 wherein said information corresponds to the magnitude of a predetermined condition other than the strength of signals received or transmitted by said radio device.

10. The radio device combination according to any of claims 6–9 wherein said fourth means comprises a digital display means for displaying a sequence of digits for indicating at least one of the frequency to which the radio is tuned and said information.

11. The radio device combination as recited in claim 10 wherein said control means comprises manually controllable panel switch means.

12. The radio device combination as recited in claim 11 wherein said first circuit means corresponds to a crystal controlled oscillator.

13. The radio device combination as recited in any of claims 6–9 wherein said information corresponds to the time of day.

14. In a radio device, the combination including:

first circuit means for generating a substantially fixed frequency oscillator signal;

second circuit means coupled to said first circuit means for receiving and processing said fixed frequency oscillator signal and developing an adjustable frequency signal for tuning the radio;

third circuit means coupled to said first circuit means for receiving said fixed frequency oscillator signal and developing in response thereto at least one signal indicative of information other than the frequency to which the radio device is tuned and indicative of information unrelated to the phase and/or frequency of said adjustable frequency signal; and fourth means coupled to said third circuit means for receiving said at least one indicative signal and displaying said information.

15. The radio device combination as recited in claim 14 wherein said fourth means provides a visual display.

16. The radio device combination as recited in claim 15 which includes an RF tuning mixer stage which receives said adjustable frequency signal.

17. The radio device combination as recited in claim 16 wherein said information corresponds to the magnitude of a predetermined condition other than the strength of signals received or transmitted by said radio device.

* * * * *

UNITED STATES PATENT AND TRADEMARK OFFICE
Certificate

Patent No. 4,268,915                                    Patented May 19, 1981

On petition requesting issuance of a certificate of correction of inventorship pursuant to 35 USC 256, it has been found that the above-identified patent, through error and without any deceptive intent, improperly sets forth the inventorship. Accordingly, it is hereby certified that the correct inventorship of this patent is Bernard S. Parmet and John Marley.

Signed and Sealed this eighth Day of October, 1985.

BRADLEY R. GARRIS,
*Office of the Deputy Assistant*
*Commissioner for Patents.*

UNITED STATES PATENT AND TRADEMARK OFFICE
CERTIFICATE OF CORRECTION

PATENT NO. : B1 4,268,915
DATED : May 19, 1981
INVENTOR(S) : Bernard S. Parmet and John Marley It is certified that error appears in the above-identified patent and that said Letters Patent is hereby corrected as shown below:

In Reexamination Certificate B1 4,268,915, in claim 1, Column 1, Line 46, please delete the nonitalicized word "active" and insert the nonitalicized word --activate--.

In the same Reexamination Certificate, in claim 2, Column 1, Line 54, please delete the italicized word "representiative" and please insert the italicized word --representative--.

Signed and Sealed this

Eighth Day of July 1986

[SEAL]

Attest:

Attesting Officer

DONALD J. QUIGG

Commissioner of Patents and Trademarks

REEXAMINATION CERTIFICATE (438th)
United States Patent [19]
Parmet et al.

[11] B1 4,268,915
[45] Certificate Issued Dec. 17, 1985

[54] UNIVERSAL AUTOMOTIVE ELECTRONIC RADIO WITH DISPLAY FOR TUNING OR TIME INFORMATION

[75] Inventors: Bernard S. Parmet, Park Ridge, Ill.; John Marley, Scottsdale, Ariz.

[73] Assignee: Motorola, Inc., Schaumburg, Ill.

Reexamination Request:
No. 90/000,708, Jan. 9, 1985

Reexamination Certificate for:
Patent No.: 4,268,915
Issued: May 19, 1981
Appl. No.: 77,201
Filed: Sep. 20, 1979

Certificate of Correction issued Oct. 8, 1985.

Related U.S. Application Data

[60] Continuation of Ser. No. 789,597, Apr. 21, 1977, abandoned, which is a division of Ser. No. 583,343, Jun. 2, 1975, Pat. No. 4,135,158.

[51] Int. Cl.$^4$ .............................................. H04B 1/16
[52] U.S. Cl. ...................................... 455/158; 368/10
[58] Field of Search ....................... 455/157, 158, 181; 358/192.1; 340/721, 745, 309.3, 309.4, 309.15; 368/10

[56] References Cited

U.S. PATENT DOCUMENTS

| | | |
|---|---|---|
| 3,244,983 | 0/1966 | Ertman . |
| 3,409,836 | 0/1968 | Wallett . |
| 3,611,347 | 10/1971 | Gingell . |
| 3,613,095 | 0/1971 | Elwood . |
| 3,665,318 | 5/1972 | Hoffman . |
| 3,803,834 | 4/1974 | Reese . |

FOREIGN PATENT DOCUMENTS

| | | |
|---|---|---|
| 2206262 | 8/1973 | Fed. Rep. of Germany . |
| 48-7694 | 1/1973 | Japan . |
| 48-16512 | 3/1973 | Japan . |
| 48-34642 | 5/1973 | Japan . |
| 48-60510 | 8/1973 | Japan . |
| 48-100044 | 12/1973 | Japan . |
| 49-79112 | 7/1974 | Japan . |
| 49-141062 | 12/1974 | Japan . |
| 50-28654 | 3/1975 | Japan . |

OTHER PUBLICATIONS

Funkschau, vol. 48, No. 9, Apr. 1976, pp. 68–71, "Digitale Frequenz-Kanal-und Zeitanzeige in einem Spitzen-Receiver."
Winslow Palmer–"The Omega Navigation System as a Source of Frequency and Time", Symposium on Frequency Control, Apr. 24, 1970, pp. 345–360.
"Electronics", Jun. 28, 1965, pp. 112–115.

*Primary Examiner*—Marc E. Bookbinder

[57] ABSTRACT

Selected radio circuits are fabricated on modules which plug into a "mother" board located in the radio chassis. The circuitry includes a plurality of RF front ends (including at least one AM and one FM front end), each tunable over a selected radio band by tuner circuitry. The AM front end includes a saturable core reactor whose tuning inductance varies as a function of the tuning current provided to it by a voltage-to-current converter in the tuner.

Both AM and FM signals are translated by a frequency synthesizer to a common IF frequency, namely 10.7 MHz. The synthesizer employs a quartz crystal controlled oscillator feeding a phase lock loop whose frequency is varied via the tuning control. Quartz crystal filters for AM, and ceramic filters for FM provide required selectivity. As all signals are at the same IF, a common IF amplifier is employed. Further, a single phase lock loop is adapted to demodulate both AM and FM signals.

The resultant demodulated signals are amplified, and tone shaped, via D.C. voltage controlled audio processor circuitry. The audio circuitry is adapted to accept auxiliary inputs, such as the output of a tape player.

A digital display senses tuner status providing frequency read out. Additional provisions allow switching the display to read out tape player status, or to provide a time display from an electronic clock.

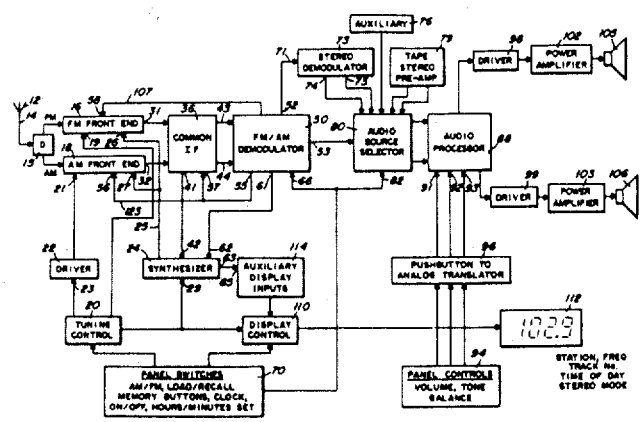

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 4–6, 12 and 14 are determined to be patentable as amended.

Claims 3, 7–11, 13 and 15–17, dependent on an amended claim, are determined to be patentable.

New claims 18–23 are added and determined to be patentable.

1. A radio/clock combination comprising:
   a radio which produces an output signal representative of the frequency to which the radio is tuned, and
   a clock which produces an output signal representative of the time of day,
   wherein the improvement comprises:
   control means selecting either the radio output or clock output signal including means for predeterminedly scaling and processing the selected signal to activate selected readout drivers,
   readout devices coupled to corresponding drivers which, when activated, produce a desired display,
   oscillator means producing an output signal of predetermined frequency,
   means processing the oscillator *means* output signal to tune the radio *to a desired frequency, the desired frequency being a function of the predetermined frequency of said oscillator means output signal*, and
   means processing the oscillator *means* output signal to active the clock,
   whereby the readout selectively displays either the frequency to which the radio is tuned or the time of the day.

2. [The combination of claim 1 wherein the oscillator is] *A radio/clock combination comprising:*
   *a radio which produces an output signal representative of the frequency to which the radio is tuned, and*
   *a clock which produces an output signal representiative of the time of day,*
   *wherein the improvement comprises:*
   *control means selecting either the radio output or clock output signal including means for predeterminedly scaling and processing the selected signal to activate selected readout drivers,*
   *readout devices coupled to corresponding drivers which, when activated, produce a desired display,*
   crystal controlled *oscillator means producing an output signal of predetermined frequency,*
   *means processing the oscillator means output signal to tune the radio, and*
   *means processing the oscillator means output signal to activate the clock,*
   *whereby the readout selectively displays either the frequency to which the radio is tuned or the time of day.*

4. In a radio/clock combination wherein radio tuning is accomplished by varying of a tuning signal and wherein the time of day is derived from a predetermined time base signal, the improvement comprising:
   oscillator means for producing a predetermined frequency signal;
   tuning means for predeterminedly processing said oscillator *means* produced signal to provide the radio tuning signal, *the frequency of the radio tuning signal being a function of the frequency of said oscillator means produced signal*;
   timing means for predeterminedly processing said oscillator *means* produced signal to provide the time base signal;
   digital display means for displaying a sequence of digits; and
   display control means for selectively sensing the tuning of the radio or the time of the clock and, in response thereto, driving said digital display means for displaying only the corresponding one of the frequency to which the radio is tuned and the time of day.

5. In a radio/clock combination:
   oscillator means for generating an oscillator signal *of a predetermined frequency*;
   tuning means coupled to said oscillator means for receiving and processing said oscillator signal and developing a signal for tuning the radio, *the frequency of the radio tuning signal being a function of the frequency of said oscillator signal*;
   clock means coupled to said oscillator means for receiving and processing said oscillator signal and developing at least one signal indicative of the time of day;
   digital display means for displaying a sequence of digits adapted for displaying either the time of day or the frequency to which the radio is tuned; and
   manual control means coupled to said tuning, clock and digital display means for selecting, and causing said display means to indicate, only one of either the time of day or the frequency to which the radio is tuned.

6. In a radio device, the combination including:
   first circuit means for generating a substantially fixed frequency oscillator signal;
   second circuit means coupled to said first circuit means for receiving and processing said fixed frequency oscillator signal and developing an adjustable frequency signal for tuning the radio, *the frequency of said adjustable frequency signal being a function of the fixed frequency of the oscillator signal*;
   third circuit means coupled to said first circuit means for receiving said fixed frequency oscillator signal and developing in response thereto at least one signal indicative of information other than the frequency to which the radio device is tuned;
   fourth means coupled to said third circuit means for receiving said at least one indicative signal and displaying said information, wherein said fourth means is adapted for visually displaying either the frequency to which the radio is tuned or said information; and
   control means coupled to said second circuit, third circuit and fourth means for selecting and causing said fourth means to indicate only one of either the frequency to which the radio is tuned or said information.

12. [The radio device combination as recited in claim 11] *In a radio device, the combination including:*
*first circuit means for generating a substantially fixed frequency oscillator signal, wherein said first circuit means* [corresponds to] *is a crystal controlled oscillator;*
*second circuit means coupled to said first circuit means for receiving and processing said fixed frequency oscillator signal and developing an adjustable frequency signal for tuning the radio;*
*third circuit means coupled to said first circuit means for receiving said fixed frequency oscillator signal and developing in response thereto at least one signal indicative of information other than the frequency to which the radio device is tuned;*
*fourth means coupled to said third circuit means for receiving said at least one indicative signal and displaying said information, wherein said fourth means is adapted for visually displaying either the frequency to which the radio is tuned or said information; and*
*control means coupled to said second circuit, third circuit and fourth means for selecting and causing said fourth means to indicate only one of either the frequency to which the radio is tuned or said information;*
*wherein said fourth means comprises a digital display means for displaying a sequence of digits for indicating at least one of the frequency to which the radio is tuned and said information; and*
*wherein said control means comprises manually controllable panel switch means.*

14. In a radio device, the combination including:
first circuit means for generating a substantially fixed frequency oscillator signal;
second circuit means coupled to said first circuit means for receiving and processing said fixed frequency oscillator signal and developing an adjustable frequency signal for tuning the radio, the frequency of said adjustable frequency signal being a function of the fixed frequency of the oscillator signal;
third circuit means coupled to said first circuit means for receiving said fixed frequency oscillator signal and developing in response thereto at least one signal indicative of information other than the frequency to which the radio device is tuned and indicative of information unrelated to the phase and/or frequency of said adjustable frequency signal; and fourth means coupled to said third circuit means for receiving said at least one indicative signal and displaying said information.

*18. In a radio device, the combination including:*
*first circuit means for generating a substantially fixed frequency oscillator signal, wherein said first circuit means is a crystal controlled oscillator;*
*second circuit means coupled to said first circuit means for receiving and processing said fixed frequency oscillator signal and developing an adjustable frequency signal for tuning the radio;*
*third circuit means coupled to said first circuit means for receiving said fixed frequency oscillator signal and developing in response thereto at least one signal indicative of information other than the frequency to which the radio device is tuned;*
*fourth means coupled to said third circuit means for receiving said at least one indicative signal and displaying said information, wherein said fourth means is adapted for visually displaying either the frequency to which the radio is tuned or said information; and*
*control means coupled to said second circuit, third circuit and fourth means for selecting and causing said fourth means to indicate only one of either the frequency to which the radio is tuned or said information.*

*19. The combination of claim 4 wherein said tuning means comprises a phase locked loop (P.L.L.) which receives said oscillator means produced signal and provides said radio tuning signal in response thereto, said P.L.L. including a phase detector for effectively comparing said oscillator means produced signal with a signal having its frequency related to the frequency of said radio tuning signal.*

20. The radio device combination as recited in claim 6 wherein said second circuit means includes a phase locked loop which receives said fixed frequency signal as an input and provides said adjustable frequency signal as an output.

21. The radio device combination as recited in claim 20 wherein said phase locked loop includes a phase detector for effectively comparing said fixed frequency signal with a signal having its frequency related to the frequency of said adjustable frequency tuning signal.

22. The radio device combination as recited in claim 14 wherein said second circuit means includes a phase locked loop which receives said fixed frequency oscillator signal as an input and provides said adjustable frequency signal as an output.

23. The radio device as recited in claim 22 wherein said phase locked loop includes a phase detector for effectively comparing said fixed frequency signal with a signal having frequency related to the frequency of said adjustable frequency tuning signal.

* * * * *